United States Patent [19]

Tamura et al.

[11] Patent Number: 5,036,471
[45] Date of Patent: Jul. 30, 1991

[54] APPARATUS FOR ROAD PATH SEARCHING APPLICABLE TO CAR NAVIGATION SYSTEM AND OPERATION METHOD THEREOF

[75] Inventors: Yutaka Tamura; Yoshio Hosokawa; Satoshi Noro; Kazuhiko Kondo, all of Gifu, Japan

[73] Assignee: Sanyo Electric Co., Ltd., Japan

[21] Appl. No.: 509,991

[22] Filed: Apr. 16, 1990

[30] Foreign Application Priority Data

Apr. 18, 1989 [JP] Japan ................................. 1-98335

[51] Int. Cl.⁵ ............................................. G06F 15/50
[52] U.S. Cl. .................................... 364/449; 340/995; 73/178 R
[58] Field of Search ................ 340/990, 995; 364/443, 364/449; 73/178 R

[56] References Cited

U.S. PATENT DOCUMENTS

| | | | |
|---|---|---|---|
| 4,513,377 | 4/1985 | Hasebe et al. | 340/990 |
| 4,570,227 | 2/1986 | Tachi et al. | 340/995 |
| 4,689,747 | 8/1987 | Kurose et al. | 340/995 |
| 4,761,742 | 8/1988 | Hanabusa et al. | 340/995 |
| 4,796,189 | 1/1989 | Nakayama et al. | 340/990 |
| 4,873,513 | 10/1989 | Soulys et al. | 340/990 |
| 4,897,792 | 1/1990 | Hosoi | 364/449 |
| 4,926,336 | 5/1990 | Yamada | 340/995 |
| 4,937,753 | 6/1990 | Yamada | 340/995 |
| 4,954,959 | 9/1990 | Moroto et al. | 364/449 |

Primary Examiner—Salvatore Cangialosi
Attorney, Agent, or Firm—Peter L. Michaelson

[57] ABSTRACT

A road path searching apparatus applicable to a car navigation system is disclosed. Road map data with different level of detail for defining a predetermined area is stored previously in a memory device. First, nodes Nai and Nbj adjacent to each of the search nodes Pa and PB are detected based on map data having a high level of detail. When nodes Nai and Nbj exist on a map of a lower level of detail, a map of one lower level of detail is selected as a map to be used in the searching process. Accordingly, as following searching process is performed based on the map data of lower level of detail, required processing time is reduced.

12 Claims, 6 Drawing Sheets

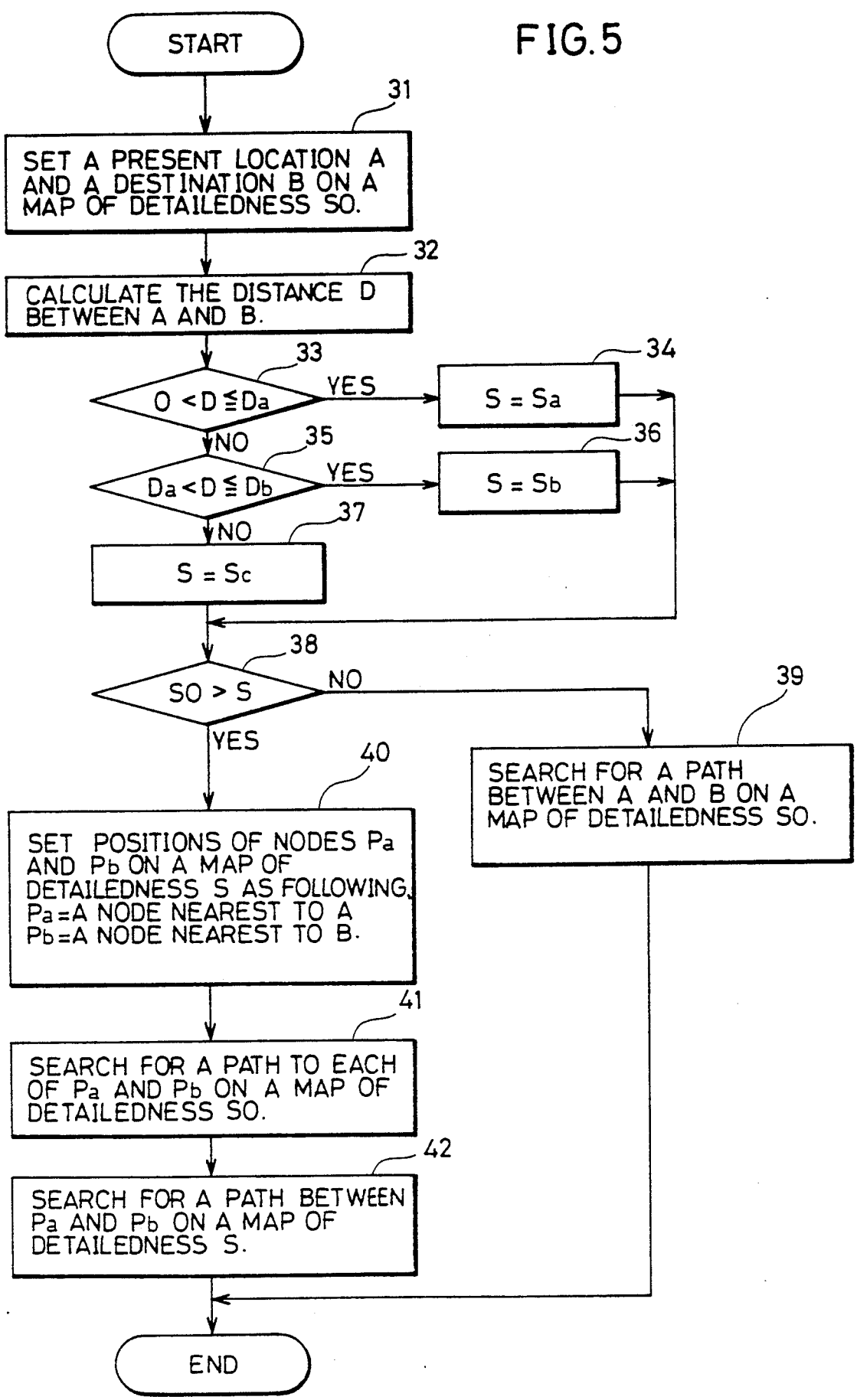

APPARATUS FOR ROAD PATH SEARCHING APPLICABLE TO CAR NAVIGATION SYSTEM AND OPERATION METHOD THEREOF

BACKGROUND OF THE INVENTION

1. Field of the Invention

The present invention generally relates to an apparatus for road path searching, and particularly to an apparatus which can search for a road path in a short time. This invention has particular applicability to a car navigation system.

2. Description of the Background Art

Recently, a navigation system to be carried on a car has been developed and is commercially available. Road path searching apparatuses are provided in some such navigation systems. Upon designation of a destination, the road path searching apparatus detects a road or a path most suitable for getting to the destination from the present location, and displays the path on a CRT display. An example of a conventional road path searching apparatus is described in Japanese Patent Laying-Open No. 62-86500. By employing a road path searching apparatus, a driver can take the displayed most suitable road and arrive at the destination in the shortest time.

A conventional road path searching apparatus, however, requires a long time to detect a road or a path to be taken by a driver. Generally, a plurality of road maps with different detailedness (level of detail) or amount of data for showing one area are previously provided for in a navigation system. When path searching is performed by a road path searching apparatus, a location of the present time and a destination are designated or set in the first place. Generally, as the present location and the destination often face relatively narrow roads, designation or setting thereof is performed based on detailed or high detailed road map data. Thus, when a road path searching apparatus searches for a preferable road path, the search is performed based on the detailed road map data. Generally, there are a great number of roads to be taken on the way from the present location to the destination on a detailed road map. A great amount of processing is required to select the suitable one out of the enormous number of road combinations. As a result, it takes a long time to search for a preferable road path. In addition, even if the road path is detected taking a long time, the detected path often includes narrow roads. In practice, as a driver generally does not like to drive on narrow roads on the way, the detected road or path is not useful for the driver in some cases.

A further example of a conventional road path searching apparatus is described in Japanese Patent Laying-Open No. 61-213718. Also in the disclosed road path searching apparatus, road map data of different detailedness for one area are provided for in advance. In the retrieving operation, after road searching based on a less detailed road map, or road map data of low detailedness, road searching based on road data of high detailedness is performed. That is to say, the detailedness of the road data used in searching operation gradually advances from low level to high level. More specifically, first, main intersections to be passed are detected based on a simple road map, and next, intersections between the detected main intersections are detected based on a road map more detailed by one level. In other words, each portion between one intersection and the other intersection detected on a less detailed road map is interpolated by intersections detected on a map containing an additional level of detail. By repeating the interpolation process from low level to high level of detail, intersections to be passed are determined. As a result, time required for road searching is reduced compared to the above described example of the prior art.

SUMMARY OF THE INVENTION

It is an object of the invention to reduce time required to search for a road path between two positions in a path searching apparatus.

It is another object of the invention to select the most major possible roads as roads to be searched for by a path searching apparatus.

It is still another object of the invention to select the data to be used a searching process by a path searching apparatus in the order of detail beginning with a more detailed road data to a less detailed road data.

It is yet another object of the invention to reduce time required to search for a road path between two positions in a car navigation system.

It is a still further object of the invention to reduce time required to search for a road path between a starting point and a destination point in a car navigation system.

In short, a path searching apparatus in accordance with this invention comprises a storage device to store node data for defining roads provided on a predetermined area. The storage device stores a first data group for defining roads in more detail and a second data group for defining roads in less detail. The first data group comprises data which coincides with that of the second data group. This path searching apparatus further comprises a designating device for designating first and second positions based on the first data group, an adjacent node detecting device for detecting first and second adjacent nodes respectively adjacent to the first and second positions, an existence detecting device for detecting existence of node data corresponding to at least one of the detected first and second adjacent nodes in the second data group, and a determining device responsive to the existence detecting device to determine the detected adjacent node data as node data defining a path to be searched for.

In operation, when at least one of the first and second adjacent nodes detected by the adjacent node detecting device exists in the second data group, the determining device determines the adjacent node data as path data defining the path to be searched for. Thus, as the path data is selected out of the second data group defining roads in less detail, following path searching is performed based on the second data group. Accordingly, as the data amount to be processed is reduced, time required for the searching process is shortened.

In another aspect, the path searching apparatus in accordance with this invention comprises a storage device for storing node data for defining roads provided on a predetermined area. The storage device stores a first data group for defining roads in more detail and a second data group for defining roads in less detail. The first data group comprises data which coincides with data of the second data group. The path searching apparatus further comprises a designating device for designating first and second positions based on the first data group, a distance detecting device for detecting distance between the first and second positions, a selecting device responsive to the distance detecting device to select either of the first or second data groups, and a searching device for searching for a path between the first and second positions based on the data group selected by the selecting device.

In operation, in response to the detected distance between the first and second positions, a data group to be used is selected. Thus, the time required for the searching process is reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a flow chart of a processing operation of a road path searching apparatus illustrating another embodiment of this invention.

DESCRIPTION OF THE PREFERRED EMBODIMENT

Figure 1:
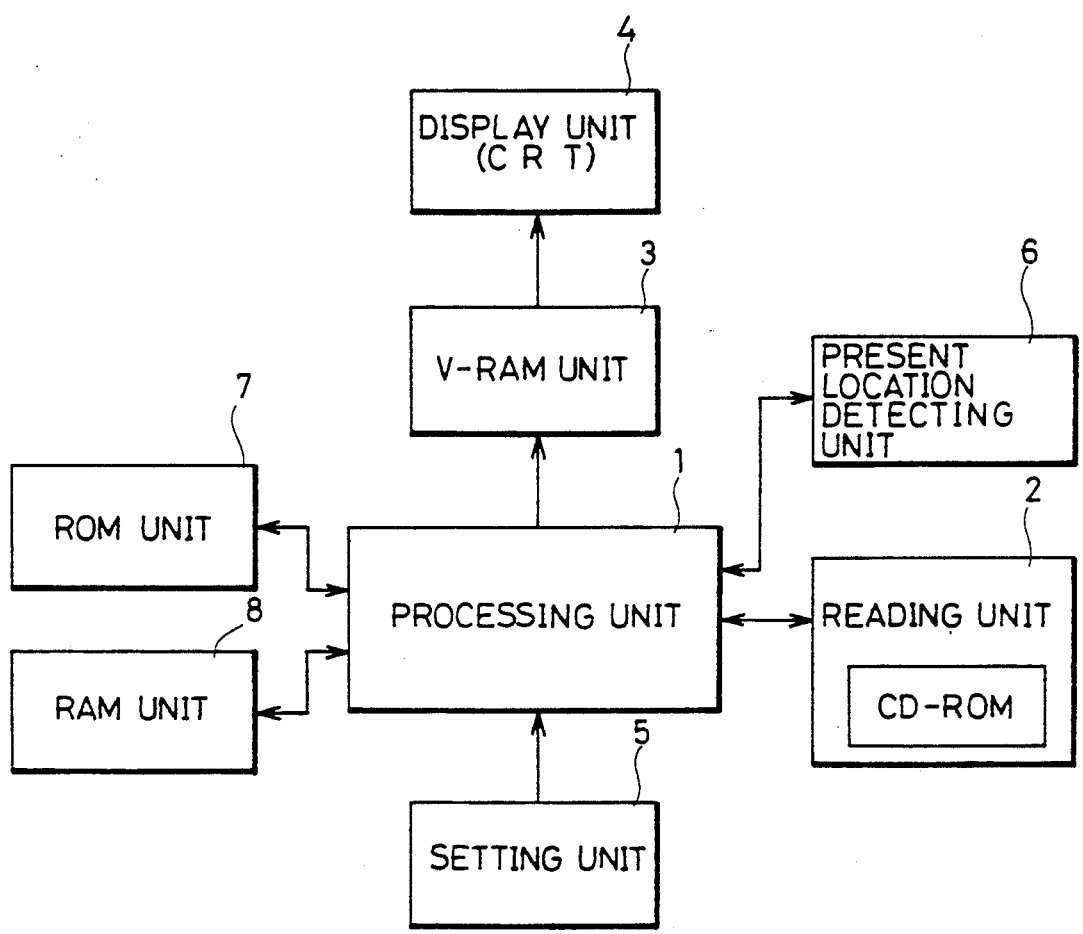
FIG. 1 is a block diagram of a hardware of a road path searching apparatus illustrating one embodiment of this invention.

Referring to FIG. 1, a road path searching apparatus comprises a processing unit 1 including a microcomputer, a reading unit 2 having a compact disc read only memory (referred to as "CD-ROM" hereinafter), an video random access memory (V-RAM) 3 for holding map data constituting one display, a display unit 4 having a CRT, a setting unit 5 having several operation buttons, a ROM unit 7 having a stored road searching process program, and a RAM unit 8 for storing road map data employed in road searching process.

In operation, the CD-ROM in the reading unit 2 comprises road data prepared in advance for each of the detailedness levels (levels of detail) that are different from each other. The V-RAM unit 3 holds the road map data read from the CD-ROM in the reading unit 2. The CRT in the display unit 4 displays the road map based on the held data. By operating the operation buttons in the setting unit 5, a driver performs selection of a road map, designation of the detailedness of the map, designation or setting of a present location and a destination, entry of instructions of road path searching and the like. For example, when a road map and its detailedness are designated by the operation of the operation buttons by the driver, the processing unit 1 instructs the reading unit 2 to read the data. Thus, the road map data is read from the CD-ROM in the reading unit 2, and the read data is provided to the V-RAM 3 after being processed in the processing unit 1. As a result, the processed road map is displayed on the CRT screen in the display unit 4.

By referring to the map displayed on the CRT screen, the driver moves a cursor on the CRT screen by operating the operation buttons and designates or sets a present location and a destination. While the position of the car changes as the driver drives the car, the present location detecting unit 6 detects the amount of change and estimates the present location. The processing unit 1 rewrites the position data in the V-RAM unit 3 based on the estimated present location data. Accordingly, the display of the present location of the car on the CRT screen in the display unit 4 is changed. Instead of designating or setting the present location with the operation buttons as described above, it is also preferable to perform the operation automatically based on the detected data in the present location detecting unit 6.

Figure 2:
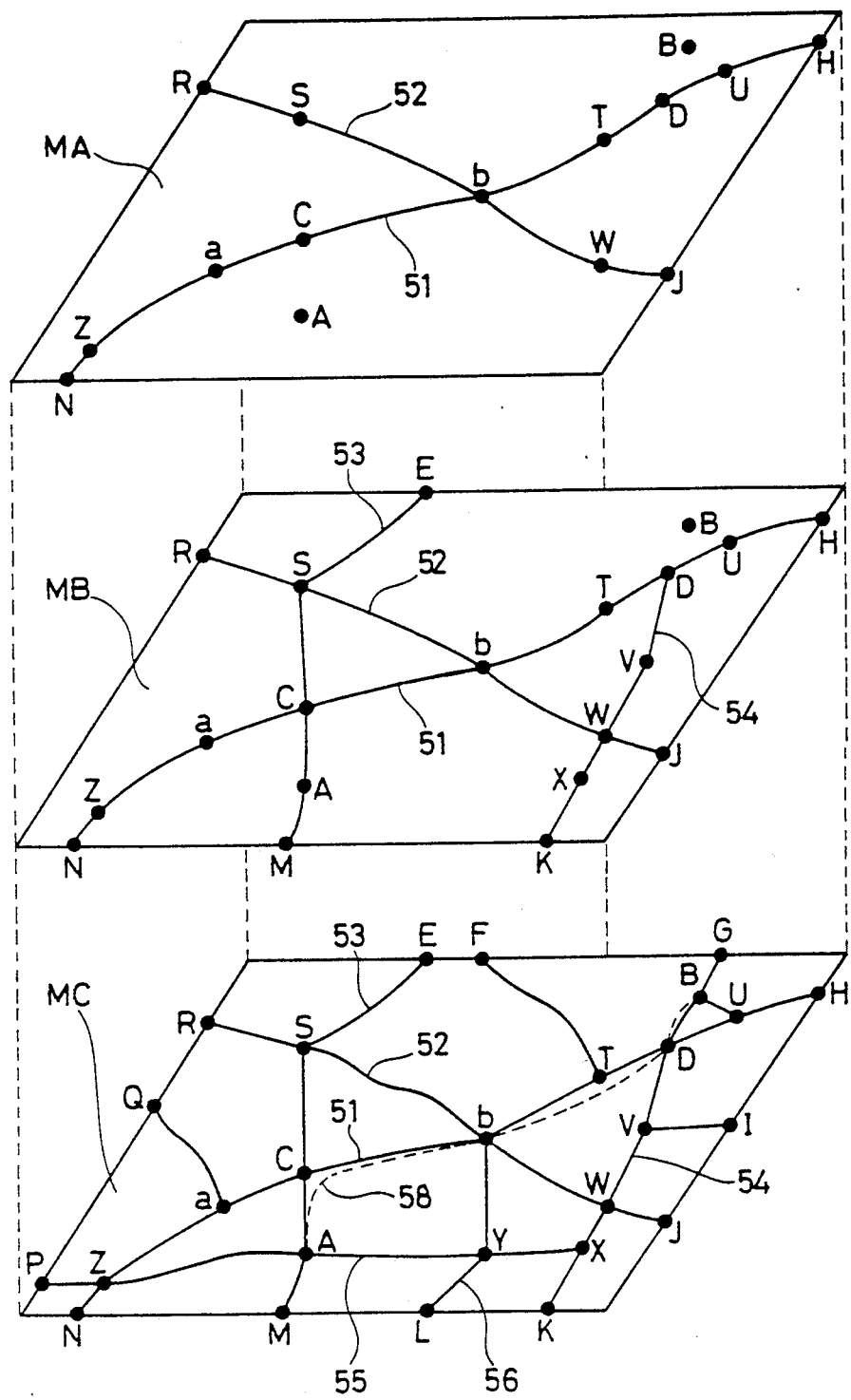
FIG. 2 is a conceptual diagram of road map data used in a road path searching apparatus.

Road maps illustrated in FIG. 2 to be used in road searching are previously prepared in the CD-ROM in the reading unit 2 illustrated in FIG. 1. Referring to FIG. 2, road maps with different detailedness levels MA, MB and MC are illustrated. While these three maps MA, MB and MC illustrate the same area, their detailedness, i.e., levels of the detail of diagrammatical information contained in respective maps, are different from each other. That is to say, the detailedness $S_{MC}$ of the road map MC is the highest and the detailedness $S_{MA}$ of the road map MA is the lowest. Thus, detailedness of respective road maps MA, MB and MC, i.e., $S_{MA}$, $S_{MB}$ and $S_{MC}$, are set to satisfy the following relation.

$$S_{MA} < S_{MB} < S_{MC} \quad (1)$$

For example, while main principal roads are illustrated on the road map MA, principal roads that are more important than prefectural roads, including main principal roads, are shown on the road map MB. Furthermore, in addition to the road data of the maps MA and MB, the data of the road map MC comprises road data of narrower roads.

Figure 3A:
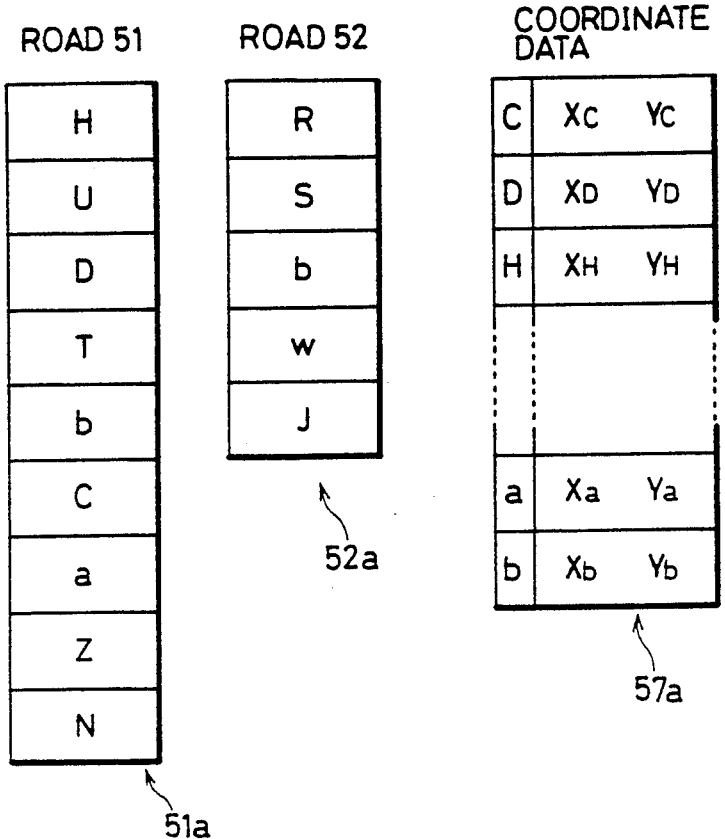
FIGS. 3A, 3B and 3C are block diagrams illustrating examples of road map data prepared in advance in a road path searching apparatus.
Figure 3B:
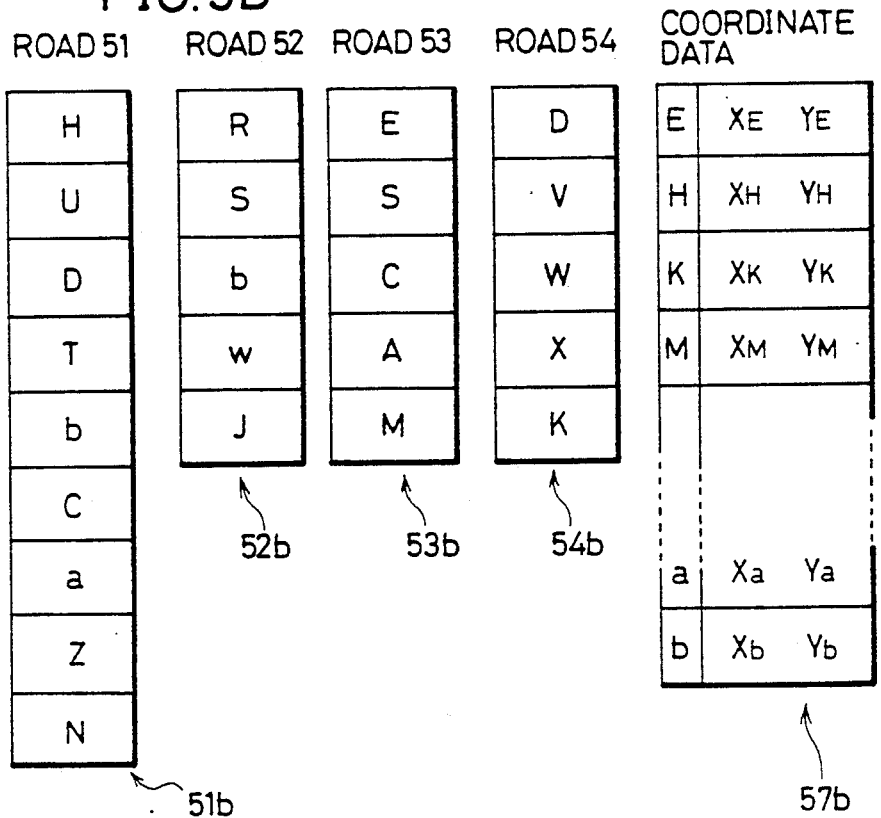
Figure 3C:
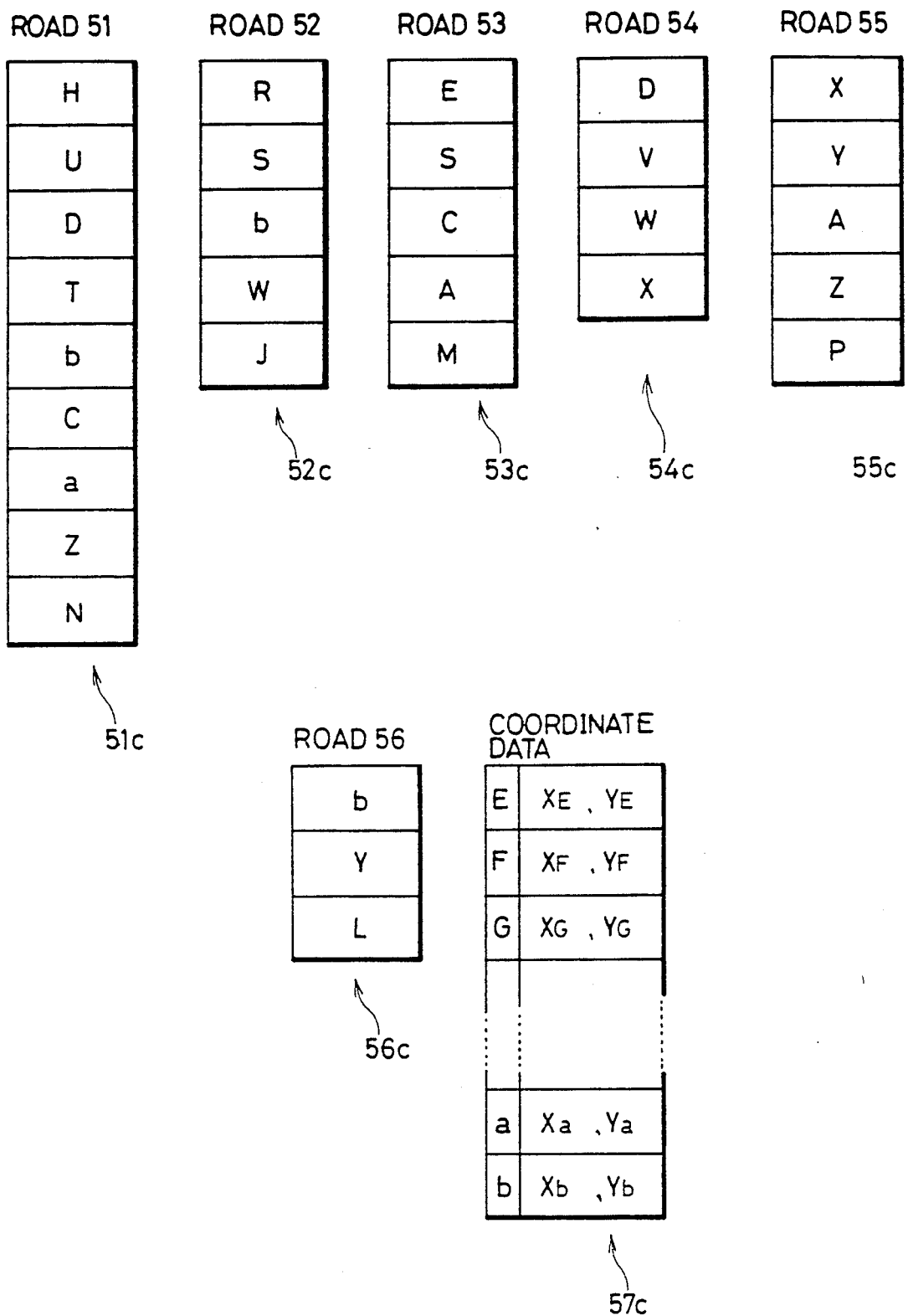

Referring to FIGS. 3A, 3B and 3C, respective road data prepared in advance in the CD-ROM will be described more specifically. FIG. 3A shows data 51a, 52a and 57a prepared as road data of the map MA. The map MA, as illustrated in FIG. 2, comprises two main principal roads 51 and 52, and nodes N, Z, . . . which correspond to intersections on the respective roads. Thus, the CD-ROM stores a series of node data 51a and 52a defining respective roads 51 and 52, and coordinate data 57a defining positions of respective nodes. The positions of the respective nodes are defined based on the X-Y coordinates commonly predetermined in relation to the maps MA, MB and MC. Accordingly, for example, the node C is defined by the coordinates ($X_C$, $Y_C$) as illustrated in FIG. 3A.

Similarly, the road data of the map MB is shown in FIG. 3B. This road data comprises node data 51b, 52b, 53b and 54b which define a series of nodes constituting respective roads 51, 52, 53 and 54, and coordinate data 57b defining positions of all the nodes on the map MB. The node data 51b and 52b are the same as the node data 51a and 52a shown in FIG. 3A. The coordinate data commonly included in the coordinate data 57a and 57b, e.g., the coordinate data of nodes H, a, b are identical. A series of node data 53b and 54b constituting the roads 53 and 54 are newly stored. In addition, the coordinate data of nodes which do not exist on the map MA but exist on the map MB, for example, nodes E, K, M are newly stored.

As in the case of the maps MA and MB, node data 51c, 52c, 53c, 54c, 55c and 56c of the map MC and coordinate data 57c of the respective nodes on the map MC are shown in FIG. 3C. As seen by comparing FIG. 3A, 3B and 3C, as the detailedness of the respective maps increases, further road node data and node coordinate data are correspondingly prepared are added. Thus, it is also understood that the detailedness $S_{MC}$ of the map MC is the highest and the detailedness $S_{MA}$ of the map MA is the lowest.

Referring to FIGS. 2, 3A, 3B, 3C and 4, the road path searching process is described below. In the description, it is presumed that the present location is defined by a node A and a destination is defined by a node B. First, in step 11, a driver sets the present location A and the destination B on a map of initial detailedness S0. As shown in FIG. 2, both of the nodes A and B do not exist on the roads depicted in the map MA or MB. On the other hand, both of the nodes A and B exist on the roads depicted in the map MC. Therefore, the driver selects the map MC with the detailedness $S_{MC}$ as the initial detailedness S0 and sets the present location A and the destination B on the map MC. As a result, in step 12, the detailedness of the map to be searched (referred to as "searching detailedness" hereinafter) S is set as "S=S0" and the nodes selected by the search (each of which is referred to as "search node" hereinafter) Pa and Pb are set at nodes A and B, respectively. After the setting, the searching process for searching for a road path is performed on the road map of the search detailedness S starting at the respective search nodes Pa and Pb as described below.

In step 13, nodes Nai and Nbj adjacent to respective search nodes Pa and Pb, respectively, are detected on a map of search detailedness S (i, j=1, 2, ... ). For example, on the map MC shown in FIG. 2, the nodes C, M, Y and Z are detected as nodes Nai adjacent to the search node (corresponding to a present location) A. The nodes Nai are defined as a group of nodes Nai which can be reached from the node Pa in the first place on the map MC. Accordingly, by referring to the node data 53c and 55c including the node A shown in FIG. 3C, adjacent nodes C, M, Y and Z are detected. Likewise, nodes G, U and D are detected as nodes Nbj adjacent to the search node Pb.

In step 14, it is determined whether or not at least one of the detected nodes Nai exists on the map of detailedness "S−1". For example, it is determined whether the detected nodes C, Y, M and Z exist on the map MB of detailedness lower by one level than that of the map MC. As a result, it is detected from the node data 53b and 51b shown in FIG. 3B that there are nodes C, M and Z on the map MB. Then, in step 18, it is further determined whether or not at least one of the nodes Nbj exists on the map of detailedness "S−1". In the example shown in FIG. 2, by retrieving the data shown in FIG. 3B, it is detected that the nodes D, U exist on the map MB. Accordingly, the process of step 19 is started. That is to say, in this case, as at least one of each of the nodes Nai and Nbj exist on a map of one level lower detailedness, the search detailedness S is reduced by one level (S=S−1).

In step 20, it is determined whether only one of each of the respective nodes Nai and Nbj, respectively, exist on a map of detailedness S or not. For example, when only one node is detected as Nai, that node Nai is set as a search node Pa in step 22. Likewise, when only one of the nodes Nbj exists, that node Nbj is set as a search node Pb in step 22. On the other hand, when a plurality of nodes Nai exist, the search node Pa is set at the node Nai nearest to the destination B. That is to say, the distances between the respective nodes Nai and the destination B are calculated based on the coordinate data, and a node of the shortest distance is selected as a search node Pa out of the nodes Nai. Similarly, when a plurality of nodes Nbj exist, a search node Pb is set at the node Nbj nearest to the starting point A in step 21. It is pointed out that when only one of the nodes Nai and a plurality of nodes Nbj exist, and on the contrary, a plurality of nodes Nai and only one of the nodes Nbj exist, required processes are performed in respective steps 21 and 22. In step 23, the data of the search nodes Pa and Pb set in steps 21 and 22 are stored into the RAM unit 8 shown in FIG. 1. After storing, the process advances to step 17.

When the process advances to step 15, or when a decision of "NO" is made in either of step 14 or 18, a search node Pa is set at a node nearest to the destination B among nodes Nai detected in step 13 on the map of detailedness S (S=S0). Similarly, a search node Pb is set at a node among the detected nodes Nbj which is the nearest to the starting point A. Accordingly, in the embodiment shown in FIG. 2, the node C is set as a search node Pa and the node D is set as a search node Pb. After the set search nodes Pa and Pb are stored in the RAM unit 8 shown in FIG. 1 in step 16, the process advances to step 17.

In step 17, it is determined whether two search nodes Pa and Pb coincide with each other or not. In the case of no coincidence detected, the process returns to step 13. In this case, the process described above is repeated based on the current search nodes Pa and Pb. In the case of coincidence detected in step 17, the road path searching process is completed. The path from the starting point A to the destination B decided based on the nodes searched for has been already stored in the RAM unit 8.

As described above, when no coincidence is detected in step 17, the process returns to step 13, where the following points are noted. As already described, when at least one of the detected nodes Nai and at least one of the detected nodes Nbj exist on the map of detailedness "S−1", step 19 is performed. By performing step 19, subsequent road searching process is performed based on the road data of a map of one level lower detailedness. That is to say, in the embodiment shown in FIG. 2, instead of performing the process on the map MC, the road searching process is performed on the map MB. As can be seen in FIG. 3B and 3C, in the CD-ROM, the amount of the prepared data about the map MB is smaller than that about the map MC. Thus, as the road searching process is performed based on the smaller amount of map data, time required for the searching process is reduced. More specifically, in the example shown in FIG. 2, for example, after the nodes C and D are set as the searching nodes Pa and Pb, by referring to the data of the map MB or the node data 51b etc. shown in FIG. 3B, a path between the search nodes Pa and Pb is decided in a short time. In other words, first, nodes which also exist on a simplified map, i.e., a map of lower detailedness, are detected on a detailed map, and then a path is searched for on a simplified map, e.g., the map MA or MB shown in FIG. 2.

Figure 4:
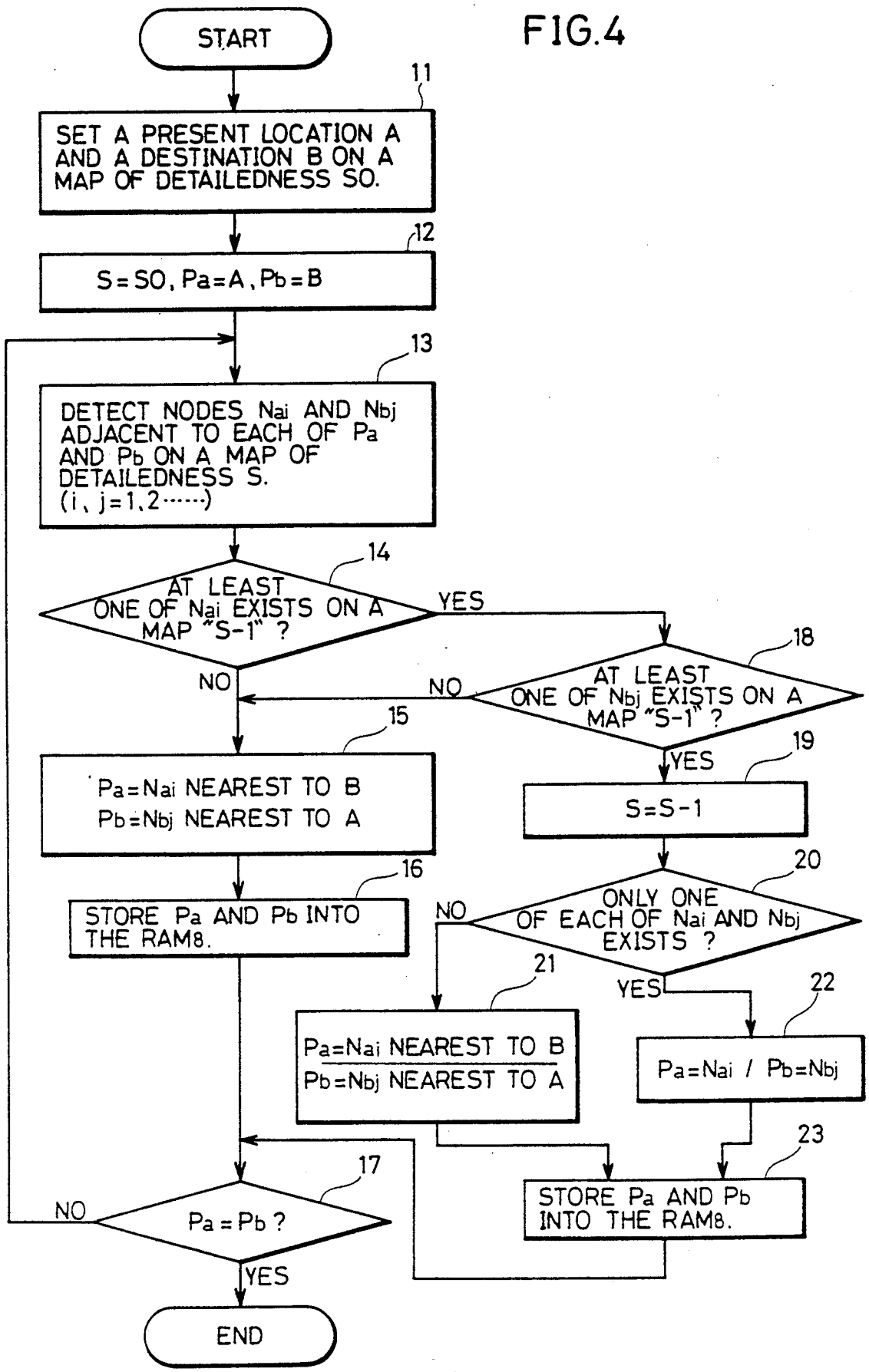
FIG. 4 is a flow chart of a processing operation of a road path searching apparatus illustrating one example of this invention.

In the road path searching process described in FIG. 4, step 19 is performed only when both of the search nodes 14 and 18 are detected to exist on a map of detailedness "S−1" in step 14 and 18. That is to say, when one or ones of either of the nodes Nai or Nbj exist(s) on a map of detailedness "S−1" but none of the other does, step 19 is not performed. As a result, it sometimes takes a long time to reduce the level of detailedness. To avoid such cases to occur, it is preferable to take such a measure as described below.

When a node or nodes of only one of the nodes Nai and Nbj exist(s) on a map of detailedness "S−1", the search process based on the one is interrupted. Thus, only the searching process based on the other is continued until a node or nodes which exist(s) on a map of detailedness "S−1" is (are) detected. When a node or nodes as the other node(s) is (are) detected to exist on a map of detailedness "S−1", the searching process of the one nodes which has been interrupted is started again. Thus, the following process is performed in relation to both of the nodes on a map of detailedness "S−1". Note that the above mentioned process contributes to certainly reduce the level at which the searching process is to be performed in a short time.

Instead of the process above, when the detailedness level of a map in which either of nodes Pa or Pb exists is the lowest, it is useful to interrupt the searching process based on the one search node. Thus, the searching process based on the other node is continued as well in this case. Instead of detecting the lowest detailedness level in this case, it can be decided to interrupt the searching process based on the predetermined low detailedness level.

Furthermore, when the distance between two search nodes Pa and Pb is shorter than a predetermined distance, it is preferable to interrupt the processing based on one node. Thus, the processing based on the other node is continued and the process is completed when positions of two search nodes searched for coincide with each other.

Moreover, in the process illustrated in FIG. 4, a problem described below may occur in case of a main principal road and a narrow road which run parallel with each other. That is to say, it is possible to happen in the road path searching that a search node on a narrow road has no way to reach a main principal road. As a result, the time of period for searching process based on map data of high detailedness becomes longer. This results in increase of time required for searching process. To solve such problems, in step 13 shown in FIG. 4, it is preferable to detect all of the nodes which exist near respective search nodes Pa and Pb as nodes Nai and Nbj. In other words, regardless of the detailedness level S set in a current step, nodes are detected as Nai and Nbj from a map of another detailedness. Thus, when a main principal road exists within a predetermined distance from a certain search node, nodes on that principal road can be detected in a short time. Therefore, it is possible to reduce the detailedness of road maps rapidly. In this case, it is required to search for a path between a node on a principal road detected as described above and a current search node based on road map data of high detailedness.

Referring to FIG. 5, another embodiment in accordance with this invention will be described below. In the embodiment, node data of roads and coordinate data of the nodes shown in FIGS. 3A, 3B and 3C are also previously prepared in the CD-ROM and employed in searching.

First, in step 31, as in the case of the preceding embodiment, a present location A and a destination B are set by a driver on a map of detailedness SO. Next, in step 32, the distance D between the present location A and the destination B is calculated based on the following formula.

$$D = \sqrt{(X_A - X_B)^2 + (Y_A - Y_B)^2} \quad (2)$$

Next, in steps 33 and 35, comparison is made in respect to the calculated distance D. Respective distances Da and Db used in steps 33 and 35 correspond to a quarter and a half, respectively, of the length of a diagonal line in the screen of the CRT. It is determined in step 33 whether the distance D satisfies the relation $0 < D \leq Da$ or not. When the relation is satisfied, searching detailedness S is set at the higher detailedness Sa in step 34. When the relation shown in step 33 is not satisfied, it is determined in step 35 whether the distance D satisfies the relation $Da < D \leq Db$ or not. When the relation is satisfied, the searching detailedness S is set at the lower detailedness Sb in step 36. When the relation defined in step 35 is not satisfied, the searching detailedness S is set at the still lower detailedness Sc in step 37.

In step 38, it is determined whether or not the searching detailedness set in the above steps 34, 36 or 37 is higher than the initial detailedness SO (SO > S). When the searching detailedness S does not satisfy the relation, a path between the present location A and the destination B is searched for on a map of the detailedness SO in step 39. On the other hand, when the relation is satisfied, or when the set searching detailedness S is lower than the initial detailedness SO, the following steps 40, 41 and 42 are performed.

In step 40, positions of respective search nodes Pa and Pb are set as described below on a map of detailedness S. A search node Pa is set at a node which is the nearest to the present location A among nodes on the map of the detailedness S. Similarly, a search node Pb is set at a node nearest to the destination B among nodes on the map of the detailedness S. After these are set, in step 41 on the map of the initial detailedness SO, a path from the present location A to the search node Pa and a path from the destination B to the search node Pb are searched for. Furthermore, in step 42, on a map of the lower detailedness S, a path between the search nodes Pa and Pb is searched for. Thus, in this embodiment as well, based on the road map data of detailedness S lower than the initial detailedness SO, a main path between the starting point A and the destination B is searched for, so that the time required for searching is reduced.

In step 40, while respective search nodes Pa and Pb are set at nodes nearest to the present location A and the destination B, respectively, it is possible to happen that a node considerably distant from the present location A or the destination B is selected. Especially, when a node in a direction different from the direction toward the destination B or the present location A is selected, a considerably roundabout path may be searched for. To avoid such an inconvenience, in step 40, it is preferable to further determine whether or not the search nodes Pa and Pb are within a predetermined range from the present location A and the destination B, respectively, and to increase the searching detailedness by one level based on the determined result.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a navigation system for processing stored electrical data representative of pre-defined locations within a given geographic area, apparatus for searching through said data to find a path between first and second geographic points situated within said area and for displaying the path comprising:

storage means (2) for storing electrical data which repeatedly defines a map of the area but at first and second different display levels, the data for the first and second display levels defining node locations that collectively represent roads situated in the area that are to be depicted at said each display level such that the first and second display levels collectively represent said map at first and second pre-defined levels of detail with the first level having more detail than said second level, the data being organized into respective first and second data groups for, respectively, the first and second display levels such that the data group for the first level includes the data group for the second level, processing means (1, 3, 5, 6, 7, 8), operative in conjunction with the storage means, for determining the path between said first and second points comprising:

designating means (11), responsive to said first and second geographic points, for designating first and second positions on the first level of the map and corresponding to the first and second geographic points, adjacent node detecting means (13), responsive to the first and second positions, for detecting a plurality of each of first and second node locations in the first level and respectively adjacent to said first and second positions so as to yield corresponding first and second pluralities of adjacent node positions, existence detecting means (14, 18), operative in response to said adjacent node detecting means, for detecting whether said second level contains at least one of each of the pluralities of said first and second adjacent node positions and for providing a result indicative thereof, determining means (20, 21, 22), responsive to said adjacent node detecting means and to the result provided by said existence detecting means, for selecting one of each of the pluralities of said first and second adjacent node positions as the first and second positions such that if the pluralities of the first and second adjacent node positions contain node locations existing in said second level then the first and second positions are taken, in a pre-defined manner, to be respective ones of said node locations existing in the second level in preference to node locations existing at the first level in the pluralities of said first and second adjacent node positions; and changing means (19), operative in response to the result provided by said existence detecting means, for subsequently changing the level of the map used by said adjacent node detecting means from the first to the second level in the event said first and second positions exist in said second level, decision means (17), responsive to said first and second positions, for invoking said adjacent node detecting means to detect next successive pluralities of said first and second node locations until the first and second positions satisfy a pre-determined criteria, and display means (4), responsive to said processing means, for displaying paths between successive ones of said first positions and between successive ones of said second positions so as to depict the path between said first and second geographic points.

2. A path searching apparatus according to claim 1, wherein said determining means comprises:

selecting means (21) for respectively selecting first and second corresponding ones of adjacent node positions from the pluralities of the first and second adjacent node positions as respective new values of the first and second positions, wherein said first and second corresponding ones of the adjacent node positions respectively represent geographic points that are nearest to geographic points represented by immediately prior ones of said first and second positions.

3. A path searching apparatus according to claim 1, wherein said existence detecting means comprises:

means (14) for detecting whether said first plurality of adjacent node locations contains node location existing in said second data group; and means (18) for detecting whether said second plurality or adjacent node locations contains node locations existing in said second data group.

4. A path searching apparatus according to claim 1, wherein said path to be searched comprises a road path on which an automobile can travel, and said respective first and second geographic points comprise a starting point and a destination, respectively.

5. In a navigation system for processing stored electrical data representative of pre-defined locations within a given geographic area, apparatus for searching through said data to find a path between first and second geographic points situated within said area and for displaying the path comprising:

storage means (2) for storing electrical data which repeatedly defines a map of the area but at first and second different display levels, the data for the first and second display levels defining node locations that collectively represent roads situated in the area that are to be depicted at said each display level such that the first and second display levels collectively represent said map at first and second pre-defined levels of detail with the first level having more detail than said second level, the data being organized into respective first and second data groups for, respectively, the first and second display levels such that the data group for the first level includes the data group for the second level, processing means (1, 3, 5, 6, 7, 8), operative in conjunction with the storage means, for determining the path between said first and second points comprising:

designating means (31), responsive to said first and second geographic points, for designating first and second positions on the first level of the map and corresponding to the first and second geographic points, distance determining means (32) for determining a geographic distance between geographic points represented by said first and second positions on the first level of the map, selecting means (34, 36, 37, 38), responsive to a value of the distance, for selecting said first or second data groups corresponding to said first or second display levels as a selected data group in which to search for said path, and searching means (40, 41, 42, 43) for searching through said selected data group so as to locate successive ones of said node locations therein as successive ones of first and second positions in order to define a path therebetween, and display means (4), responsive to said processing means, for displaying paths between successive ones of said first positions and between successive ones of said second positions so as to depict the path between said first and second geographic points.

6. A path searching apparatus according to claim 5 wherein said searching means comprises:

neighboring node detecting means (40) for detecting, in the event said second data group is selected, first and second node locations which are geographically situated closest to said first and second positions, respectively, means (41) for defining, based on nodes locations in said first data group, respective paths between said first position and said first node location and between said second position and said second node location, and means (42) for defining, based on node locations in said second data group, a path between said first and second node locations.

7. A path searching apparatus according to claim 5 wherein said selecting means comprises:

comparing means (33, 35) for comparing a predetermined distance based on a diagonal line of a display screen with the distance detected by said distance detecting means so as to determine whether said predetermined distance is greater than or equal to said detected distance and to provide a result indicative thereof, and means (34, 35, 37), responsive to the result provided by said comparing means, for selecting said first or second data group.

8. A path searching apparatus according to claim 5, wherein said path to be searched comprises a road path on which an automobile can travel, and said respective first and second geographic points comprise a starting point and a destination, respectively.

9. In a navigation system for processing stored electrical data representative of pre-defined locations within a given geographic area, said system comprising storage means (2) for storing electrical data which repeatedly defines a map of the area but at first and second different display levels, the data for the first and second display levels defining node locations that collectively represent roads situated in the area that are to be depicted at said each display level such that the first and second display levels collectively represent said map at first and second pre-defined levels of detail with the first level having more detail than said second level, the data being organized into respective first and second data groups for, respectively, the first and second display levels such that the data group for the first level includes the data group for the second level, said system further comprising processing means (1, 3, 5, 6, 7, 8) operative in conjunction with said storage means for determining a path between first and second geographic points situated in said area, and display means (4) responsive to said processing means for displaying said path, a method for searching through said data to find the path between the first and second geographic points and for displaying the path comprising the steps of:

in said processing means:

designating, in response to said first and second geographic points, first and second positions on the first level of the map and corresponding to the first and second geographic points, first detecting, in response to the first and second positions, a plurality of each of first and second node locations in the first level and respectively adjacent to said first and second positions so as to yield corresponding first and second pluralities of adjacent node positions, second detecting, in response to said first detecting step, whether said second level contains at least one of each of the pluralities of said first and second adjacent node positions and providing a result indicative thereof, selecting, in responsive to said first detecting step and to the result provided by said second detecting step, one of each of the pluralities of said first and second adjacent node positions as the first and second positions such that if the pluralities of the first and second adjacent node positions contain node locations existing in said second level then the first and second positions are taken, in a pre-defined manner, to be respective ones of said node locations existing in the second level in preference to node locations existing at the first level in the pluralities of said first and second adjacent node positions, subsequently changing, in response to the result provided by said second detecting step, the level of the map used by said first detecting step from the first to the second level in the event said first and second positions exist in said second level, and invoking, in response to said first and second positions, said first detecting step to detect next successive pluralities of said first and second node locations until the first and second positions satisfy a pre-determined criteria, and in the display means:

displaying paths between successive ones of said first positions and between successive ones of said second positions so as to depict the path between said first and second geographic points.

10. A method according to claim 9, wherein said selecting step comprises the step of:

respectively selecting first and second corresponding ones of adjacent node positions from the pluralities of the first and second adjacent node positions as respective new values of the first and second positions, wherein said first and second corresponding ones of the adjacent node positions respectively represent geographic points that are nearest to geographic points represented by immediately prior ones of said first and second positions.

11. In a navigation system for processing stored electrical data representative of pre-defined locations within a given geographic area, said system comprising storage means (2) for storing electrical data which repeatedly defines a map of the area but at first and second different display levels, the data for the first and second display levels defining node locations that collectively represent roads situated in the area that are to be depicted at said each display level such that the first and second display levels collectively represent said map at first and second pre-defined levels of detail with the first level having more detail than said second level, the data being organized into respective first and second data groups for, respectively, the first and second display levels such that the data group for the first level includes the data group for the second level, said system further comprising processing means (1, 3, 5, 6, 7, 8) operative in conjunction with said storage means for determining a path between first and second geographic points situated in said area, and display means (4) responsive to said processing means for displaying said path, a method for searching through said data to find the path between the first and second geographic points and for displaying the path comprising the steps of:

in said processing means:
designating, in response to said first and second geographic points, first and second positions on the first level of the map and corresponding to the first and second geographic points,
determining a geographic distance between geographic points represented by said first and second positions on the first level of the map,
selecting, in response to a value of the distance, said first or second data groups corresponding to said first or second display levels as a selected data group in which to search for said path, and
searching through said selected data group so as to locate successive ones of said node locations therein as successive ones of first and second positions in order to define a path therebetween, and in the display means:
displaying paths between successive ones of said first positions and between successive ones of said second positions so as to depict the path between said first and second geographic points.

12. A path searching apparatus according to claim 11 wherein said searching step comprises the steps of:
detecting, in the event said second data group is selected, first and second node locations which are geographically situated closest to said first and second positions, respectively,
defining, based on nodes locations in said first data group, respective paths between said first position and said first node location and between said second position and said second node location, and
defining, based on node locations in said second data group, a path between said first and second node locations.

* * * * *